United States Patent
Yen et al.

(10) Patent No.: US 7,327,299 B2
(45) Date of Patent: Feb. 5, 2008

(54) DIGITAL-TO-ANALOG CONVERTER FOR A SOURCE DRIVER OF A LIQUID CRYSTAL DISPLAY

(75) Inventors: Chen-Song Yen, Hsinhua (TW);
Tsung-Yu Wu, Hsinhua (TW);
Ying-Lieh Chen, Hsinhua (TW);
Lin-Kai Bu, Hsinhua (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 11/467,174

(22) Filed: Aug. 25, 2006

(65) Prior Publication Data

US 2007/0001885 A1    Jan. 4, 2007

Related U.S. Application Data

(63) Continuation of application No. 11/168,334, filed on Jun. 29, 2005, now Pat. No. 7,161,517.

(51) Int. Cl.
*H03M 1/66* (2006.01)
(52) U.S. Cl. .................. 341/145; 341/144; 341/154
(58) Field of Classification Search ........... 341/145, 341/154

See application file for complete search history.

(56) References Cited

U.S. PATENT DOCUMENTS

| 5,396,245 | A | 3/1995 | Rempfer |
| 5,731,774 | A | 3/1998 | Fujii et al. |
| 5,877,717 | A | 3/1999 | Tu et al. |
| 6,225,931 | B1 | 5/2001 | Rao et al. |
| 6,246,351 | B1 * | 6/2001 | Yilmaz ................. 341/145 |
| 6,326,913 | B1 * | 12/2001 | Chao et al. ............ 341/144 |
| 6,556,162 | B2 | 4/2003 | Brownlow et al. |

* cited by examiner

*Primary Examiner*—Khai M. Nguyen

(57) ABSTRACT

A DAC has an N-bit R-string DAC section and an (M-N)-bit interpolation DAC section. The N-bit R-string DAC section has a plurality of resistors and a 2-of-N selector. The resistors are electrically connected in series to provide a plurality of voltage levels. The 2-of-N selector is coupled to the series-connected resistors, and is arranged to select two neighboring voltage levels according to an N-bit MSB subword. The (M-N)-bit interpolation DAC section is coupled to the N-bit R-string DAC section, and is arranged to interpolate an analog output signal from the two neighboring voltage levels according to an (M-N)-bit LSB subword.

8 Claims, 4 Drawing Sheets

DIGITAL-TO-ANALOG CONVERTER FOR A SOURCE DRIVER OF A LIQUID CRYSTAL DISPLAY

CROSS-REFERENCE TO RELATED APPLICATION

This application is a continuation application of U.S. application Ser. No. 11/168,334 (now U.S. Pat. No. 7,161,517), filed Jun. 29, 2005, hereby incorporated by reference as it fully set forth herein.

BACKGROUND

1. Field of Invention

The present invention relates to digital-to-analog converters (DACs). More particularly, the present invention relates to high-resolution digital-to-analog converters.

2. Description of Related Art

Those skilled in the art know that various DAC architectures are available, such as a resistor string (R-string) DAC. FIG. 1 illustrates a schematic view of a conventional R-string DAC. An R-string DAC 100 includes a selector 122 and a plurality of resistors 112. The selector 122 includes a plurality of switching elements 126, such as MOS transistors, constructing a plurality of selecting lines 124 and switched by a digital input, such as an M-bit input word.

The resistors 112 are connected in series between a high reference voltage ($V_H$) and a low reference voltage ($V_L$). By the selector 122, the connecting nodes between the resistors 112 constitute tap points selectively switched to an output node in response to the digital input. The voltage of the tap point selectively switched to the output node is an inherently monotonic analog representation of the digital input.

For an M-bit digital-to-analog conversion, $2^M$ tap point voltage levels are required, and so $2^M+1$ resistors are required for the R-string DAC. However, this number of resistors is too large to be practical for more than approximately eight bits. Moreover, $2^{M-1} \times M$ switching elements are also required. The number of switching elements is dramatically increased as the bits of the digital input are increased. However, when the number of switching elements is increased, the layout area of a chip occupied by the switching elements is also increased. It is very unfavorable for chip design and cost reduction.

For example, although the 10-bit R-string DAC deals with only 2 more bits than the 6-bit R-string DAC, the number of switching elements of the 10-bit R-string DAC is about 26.7 times greater than that of the 6-bit R-string DAC. In addition, the 10-bit R-string DAC requires 960 more transistors than the 6-bit R-string DAC. The number of switching elements decides the X-axis width of the chip, and the number of the resistors contributes the Y-axis height of the chip. That is, the bit increasing of the digital input critically affects the chip size.

SUMMARY

It is therefore an aspect of the present invention to provide a digital-to-analog (DAC) converter, of which the circuit loading is lowered and the layout area is decreased.

According to one preferred embodiment of the present invention, the DAC is provided for converting an M-bit input word into an analog output signal, and the M-bit input word includes an N-bit MSB subword and an (M-N)-bit LSB subword. The DAC comprises an N-bit R-string DAC section and an (M-N)-bit interpolation DAC section. The N-bit R-string DAC section comprises a plurality of resistors and a 2-of-N selector.

The resistors are electrically connected in series to provide a plurality of voltage levels. The 2-of-N selector is coupled to the series-connected resistors, and is arranged to select two neighboring voltage levels according to the N-bit MSB subword. The (M-N)-bit interpolation DAC section is coupled to the N-bit R-string DAC section, and is arranged to interpolate the analog output signal from the two neighboring voltage levels according to the (M-N)-bit LSB subword.

It is another aspect of the present invention to provide an M-bit DAC for a source driver of a flat display, such as a liquid crystal display (LCD), which can reduce the number of switching elements and decrease the chip size of the source driver.

According to another preferred embodiment of the present invention, the DAC is arranged to convert an M-bit input word into an analog output signal. The DAC comprises at least two DAC portions corresponding to two segments of a gamma curve of the LCD. Each of the DAC portions comprises an N-bit R-string DAC section and an (M-N)-bit interpolation DAC section; the two Ns of the two DAC portions are different.

The N-bit R-string DAC section comprises a plurality of resistors and a 2-of-N selector. The resistors are electrically connected in series to provide a plurality of grayscale voltages. The 2-of-N selector is coupled to the series-connected resistors, and is arranged to select two neighboring grayscale voltages according to an N-bit MSB subword of the M-bit input word. The (M-N)-bit interpolation DAC section is coupled to the N-bit R-string DAC section, and is arranged to interpolate the analog output signal from the two neighboring grayscale voltages according to the (M-N)-bit LSB subword of the M-bit input word.

According to another preferred embodiment of the present invention, the DAC is arranged to convert an M-bit input word into an analog output signal. The DAC comprises a first DAC portion including an X-bit R-string DAC section and an (M-X)-bit interpolation DAC section coupled to the X-bit R-string DAC section; a second DAC portion including a Y-bit R-string DAC section coupled to the X-bit R-string DAC section and an (M-Y)-bit interpolation DAC section coupled to the Y-bit R-string DAC section; and a third DAC portion including a Z-bit R-string DAC section coupled to the Y-bit R-string DAC section. Wherein Z is greater than X and Y, and Y is greater than X.

In conclusion, compared to the conventional M-bit R-string DAC, the N-bit R-string DAC section needs fewer switching elements. Therefore, the circuit loading of the DAC is effectively lowered and the layout area is significantly decreased. Moreover, by correspondingly adjusting the numbers of bits processed by different DAC portions, the M-bit DAC for an LCD source drive can optimize the digital-to-analog conversions with respect to the segments of the gamma curve having different slopes.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings, where:

DESCRIPTION OF THE PREFERRED EMBODIMENTS

Figure 1:
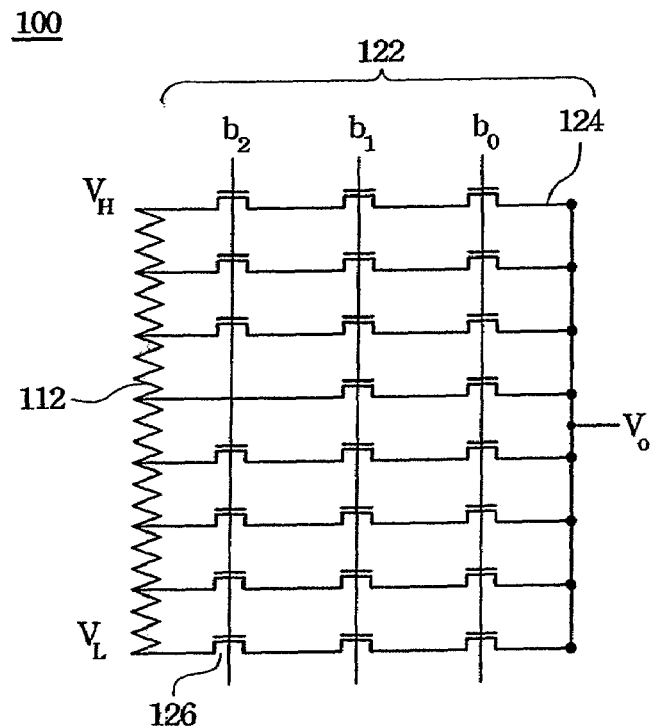
FIG. 1 illustrates a schematic view of a conventional R-string DAC.

Reference will now be made in detail to the present preferred embodiments of the invention, examples of which are illustrated in the accompanying drawings. Wherever possible, the same reference numbers are used in the drawings and the description to refer to the same or like parts.

The invention achieves an equivalent digital-to-analog conversion with a higher resolution by interpolating voltages from a preceding digital-to-analog conversion with a lower resolution. Moreover, for a gamma curve of an LCD that has at least two segments with different slopes, the invention can optimize digital-to-analog conversions with respect to the two segments by correspondingly adjusting the numbers of bits processed by different DAC portions.

Figure 2:
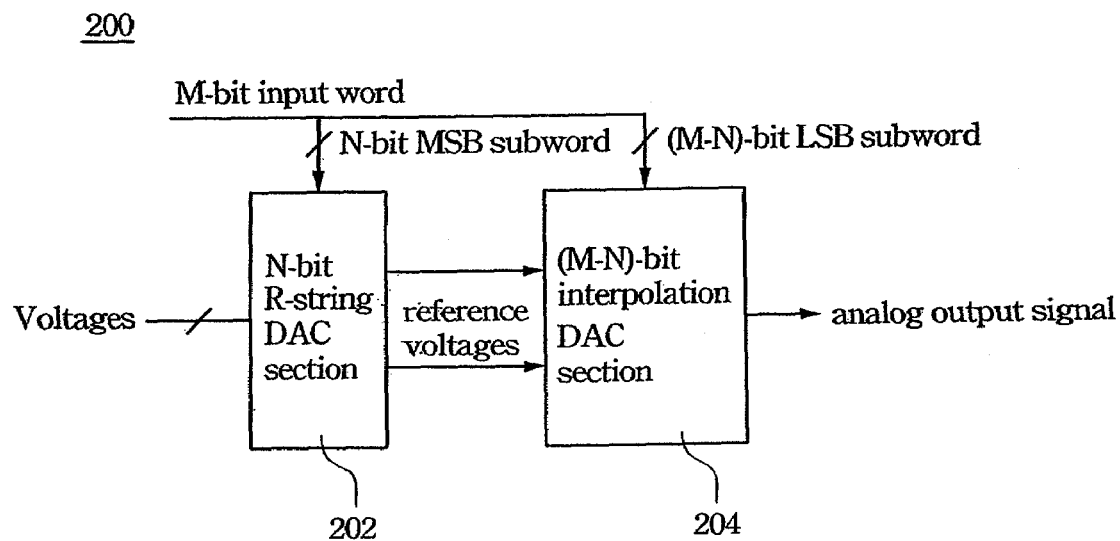
FIG. 2 is a schematic view of one preferred embodiment of the present invention.

FIG. 2 is a schematic view of one preferred embodiment of the present invention. A DAC 200 is provided for converting an M-bit input word into an analog output signal. The DAC 200 comprises an N-bit R-string DAC section 202 and an (M-N)-bit interpolation DAC section 204. An N-bit MSB subword of the M-bit input word is input into the N-bit R-string DAC section 202, and an (M-N)-bit LSB subword of the M-bit input word is input into the (M-N)-bit interpolation DAC section 204. The (M-N)-bit interpolation DAC section 204 is coupled to the N-bit R-string DAC section 202. The (M-N)-bit interpolation DAC section 204 is arranged to interpolate the analog output signal from the two neighboring voltage levels according to the (M-N)-bit LSB subword.

Figure 3:
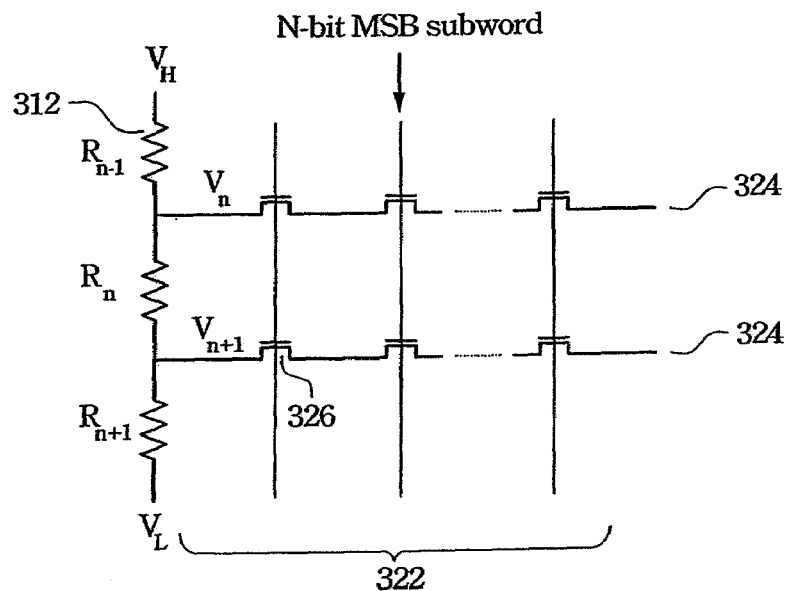
FIG. 3 is a schematic circuit diagram of one preferred embodiment of the N-bit R-string DAC section.

FIG. 3 is a schematic circuit diagram of one preferred embodiment of the N-bit R-string DAC section. An N-bit R-string DAC section 302 comprises a plurality of resistors 312 and a 2-of-N selector 322. The resistors 312 (e.g. Rn−1, Rn and Rn+1) are electrically connected in series between a high reference voltage ($V_H$) and a low reference voltage ($V_L$), for providing a plurality of voltage levels (e.g. Vn and Vn+1). The 2-of-N selector 322 is coupled to the series-connected resistors 312, and selects two neighboring voltage levels according to the N-bit MSB subword.

More particularly, the 2-of-N selector 322 has a plurality of selecting lines 324, which are coupled to and select two neighboring voltage levels from the voltage levels provided by the resistors 312. Each of the selecting lines 324 comprises a plurality of switching elements 326, which are switched by the bits of the N-bit MSB subword, respectively. By the 2-of-N selector 322, the voltage of the connecting nodes between the resistors 312, which is selectively switched to the output node, is an inherently monotonic analog representation of the N-bit MSB subword. In addition, the two neighboring voltage levels are an nth voltage levels (Vn) and an (n+1)th voltage level (Vn+1).

Figure 4:
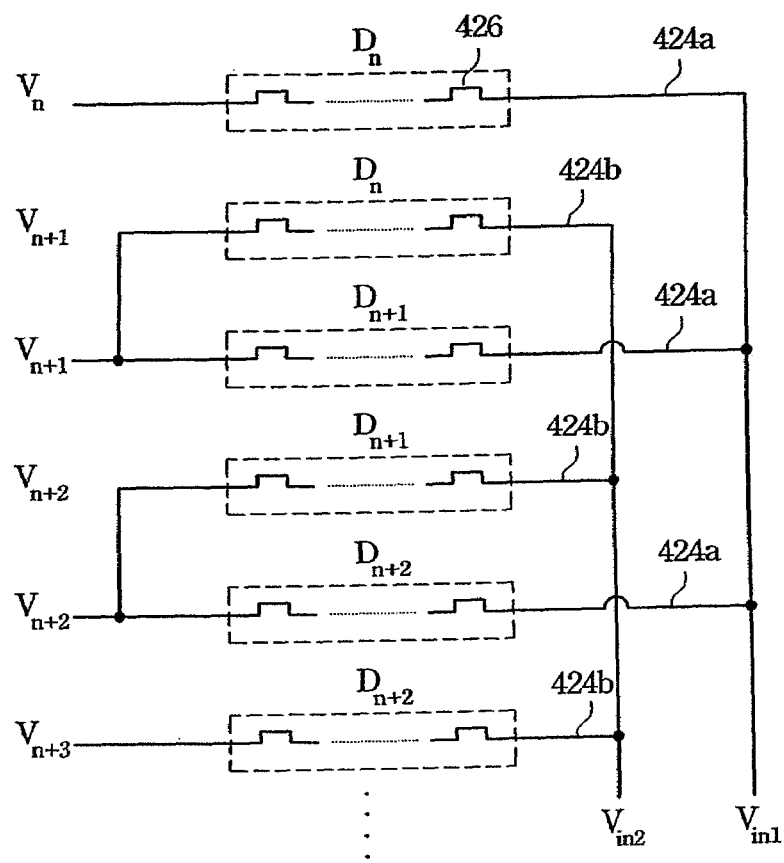
FIG. 4 is a schematic view of one preferred embodiment of the 2-of-N selector.

FIG. 4 is a schematic view of one preferred embodiment of the 2-of-N selector, for illustrating in detail how to select the two neighboring voltage levels. As implied by the name, a 2-of-N selector 422 selects two voltage levels Vin1 and Vin2 from the voltage levels (e.g. the voltage levels Vn, Vn+1, Vn+2 and Vn+3 provided by the resistors) according to one digital input (Dn), such as the N-bit MSB subword. The two voltage levels Vin1 and Vin2 are subsequently input into the (M-N)-bit interpolation DAC section 204, as illustrated in FIG. 2.

An implementation of the 2-of-N selector 422, as illustrated in FIG. 4, uses one set of selecting lines 424a and the other set of selecting lines 424b to select the two neighboring voltage levels Vin1 and Vin2, respectively. Two selecting lines 424a and 424b of the two different sets, which are switched on or off by the same N-bit MSB subword (Dn, Dn+1, or Dn+2), are separately coupled to two neighboring voltage levels. For example, the nth voltage level Vn and the (n+1)th voltage level Vn+1 correspond to the same N-bit MSB subword Dn; the (n+1)th voltage level Vn+1 and the (n+2)th voltage level Vn+2 correspond to the same N-bit MSB subword Dn+1; and the (n+2)th voltage level Vn+2 and the (n+3)th voltage level Vn+3 correspond to the same N-bit MSB subword Dn+2.

In other words, the 2-of-N selector 422 comprises $2 \times 2^N$ ($=2^{N+1}$) selecting lines 424 correspondingly coupled to the resistors 312 (as illustrated in FIG. 3) for providing the two neighboring voltage levels Vin1 and Vin2. The 2-of-N selector 422 comprises at least $2^N+1$ selecting lines 424 for the implementation of the 2-of-N selector 422. Each of the selecting lines 424a and 424b comprises N switching elements 426, like MOS transistors, switched one-to-one by the bits of the N-bit MSB subword.

Figure 5:
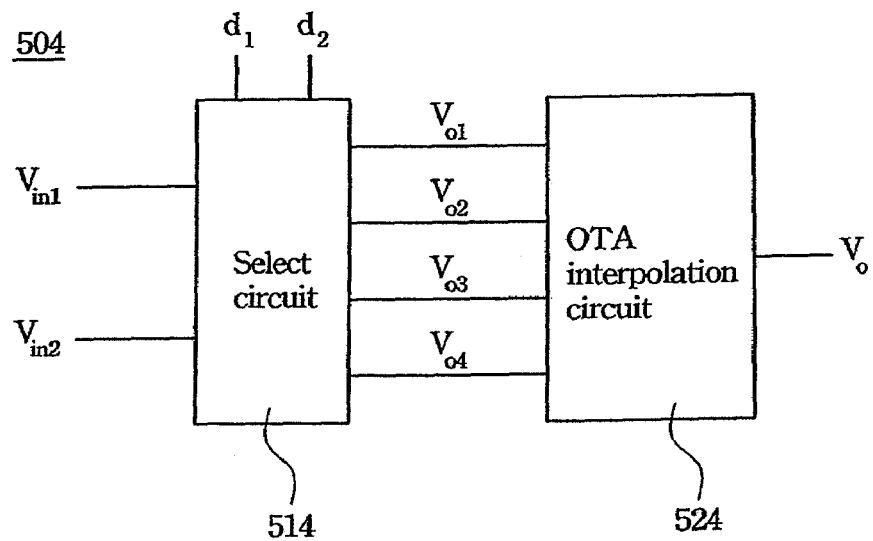
FIG. 5 is a schematic view of one preferred embodiment of the (M-N)-bit interpolation DAC section.

FIG. 5 is a schematic view of one preferred embodiment of the (M-N)-bit interpolation DAC section. An (M-N)-bit interpolation DAC section 504 comprises a select circuit 514 and an operational transconductance amplifier (OTA) interpolation circuit 524. According to the (M-N)-bit LSB subword, the select circuit 514 inputs corresponding voltage levels (e.g. Vo1, Vo2, Vo3 and Vo4) into the operational transconductance amplifier (OTA) interpolation circuit 524.

For clarity, the (M-N)-bit interpolation DAC section 504 is assumed to be a 2-bit interpolation DAC section. Therefore, a 2-bit LSB subword having two bits d1 and d2 is input into the (M-N)-bit interpolation DAC section 504, and four kinds of analog output signals can be selectively output by the (M-N)-bit interpolation DAC section 504.

The select circuit 514 receives the neighboring voltage levels Vin1 and Vin2 as stated above, and outputs four corresponding voltage levels Vo1, Vo2, Vo3 and Vo4, which can be either Vin1 or Vin2, with respect to the two bits d1 and d2 of the 2-bit LSB subword. Table 1 is a truth table of the two bits d1 and d2 of the 2-bit LSB subword and what the voltage levels Vo1, Vo2, Vo3 and Vo4 correspond to.

TABLE 1

A truth table of the bits (d1, d2) and the voltage levels (Vo1, Vo2, Vo3, Vo4).

| d1 | d2 | Vo1 | Vo2 | Vo3 | Vo4 |
|---|---|---|---|---|---|
| 1 | 1 | Vin1 | Vin1 | Vin1 | Vin1 |
| 1 | 0 | Vin1 | Vin1 | Vin1 | Vin2 |
| 0 | 1 | Vin1 | Vin1 | Vin2 | Vin2 |
| 0 | 0 | Vin1 | Vin2 | Vin2 | Vin2 |

The corresponding voltage levels Vo1, Vo2, Vo3 and Vo4 are determined by the two bits d1 and d2, and have different sets for different sets of the two bits d1 and d2.

Figure 6:
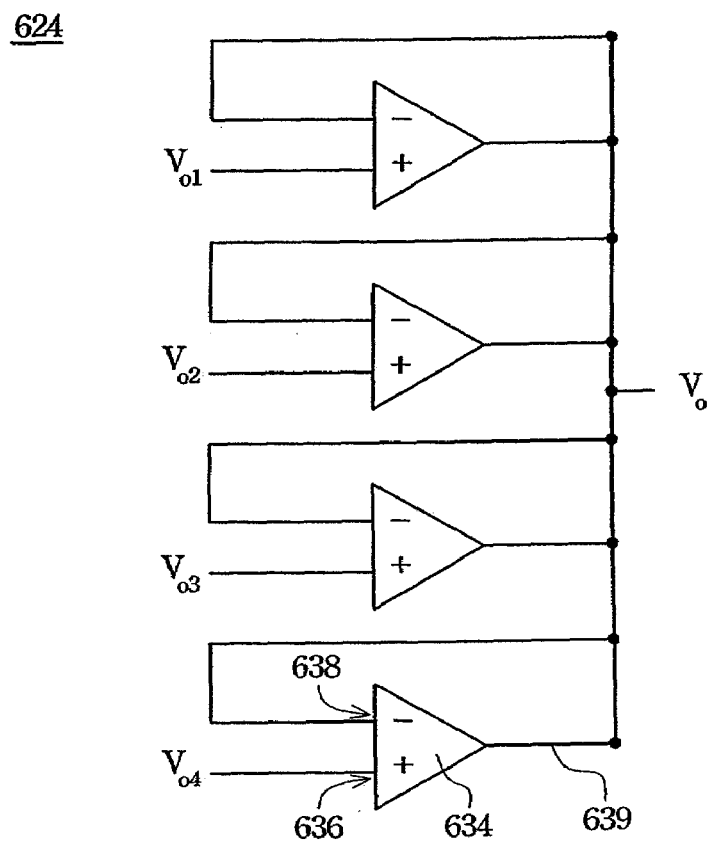
FIG. 6 is a schematic view of one preferred embodiment of the OTA interpolation circuit.

FIG. 6 is a schematic view of one preferred embodiment of the OTA interpolation circuit. An OTA interpolation circuit 624 comprises a plurality of operational transconductance amplifiers 634, such as four operational transconductance amplifiers 634 for generating four analog output signals having four different voltages Vo. Positive input terminals 636 of the operational transconductance amplifiers 634 are respectively coupled to the corresponding voltage levels Vo1, Vo2, Vo3 and Vo4, and output terminals 639 and negative input terminals 638 of the operational transconductance amplifiers 634 are coupled together. Therefore, by the OTA interpolation circuit 624, various analog output signals having different voltages Vo can be obtained by inputting different sets of the corresponding voltage levels.

More particularly, when the corresponding voltage levels comprise four Vin1, the voltage Vo of the analog output signal is equal to Vin1. When the corresponding voltage levels comprises one Vin1 and three Vin2, the voltage Vo of the analog output signal is equal to a sum of one quarter of Vin1 and three quarters of Vin2. When the corresponding voltage levels comprise two Vin1 and two Vin2, the voltage Vo of the analog output signal is equal to a sum of one half of Vin1 and one half of Vin2. When the corresponding voltage levels comprise three Vin1 and one Vin2, the voltage Vo of the analog output signal is equal to a sum of three quarters of Vin1 and one quarter of Vin2.

As mentioned above, the two bits d1 and d2 can determine which voltage levels Vin1 and Vin2 the corresponding voltage levels Vo1, Vo2, Vo3 and Vo4 correspond to. Therefore, referencing to Table 1, four equations (1), (2), (3), and (4) with respect to different sets of the bits d1 and d2 are as follows:

$$Vo = Vin1 \quad (d1, d2) = (1, 1) \quad (1)$$

$$Vo = \frac{1}{4}Vin1 + \frac{3}{4}Vin2 \quad (d1, d2) = (0, 0) \quad (2)$$

$$Vo = \frac{1}{2}Vin1 + \frac{1}{2}Vin2 \quad (d1, d2) = (0, 1) \quad (3)$$

$$Vo = \frac{3}{4}Vin1 + \frac{1}{4}Vin2 \quad (d1, d2) = (1, 0) \quad (4)$$

Accordingly, an M-bit digital-to-analog conversion can be achieved by combining a N-bit digital-to-analog conversion with an (M-N)-bit interpolation. That is, an equivalent digital-to-analog conversion with a higher resolution can be achieved by interpolating voltages from a preceding digital-to-analog conversion with a lower resolution. Moreover, compared to the conventional M-bit R-string DAC, the N-bit R-string DAC section needs fewer switching elements because the associated (M-N)-bit interpolation DAC section deals with a part of bits of the M-bit input word. Therefore, the circuit loading of the DAC is effectively lowered and the layout area is significantly decreased.

One application of the present invention is as an M-bit DAC for a source driver of an LCD. The LCD generally requires a high-resolution digital-to-analog conversion and has a non-linear gamma curve with at least two different slopes.

In this application, the above-mentioned voltage levels are grayscale voltages. The M-bit DAC comprises at least two DAC portions corresponding to two segments of the gamma curve, which separately have different slopes. Each of the DAC portions comprises an N-bit R-string DAC section and an (M-N)-bit interpolation DAC section, and the two Ns of the two DAC portions are different.

The detailed descriptions and figures of embodiments of the N-bit R-string DAC sections and the (M-N)-bit interpolation DAC sections are substantially illustrated in FIGS. 2, 3, 4, 5, 6 and their descriptions. The following descriptions particularly interpret how to correspondingly adjust the numbers of bits processed by different DAC portions, in order to optimize the digital-to-analog conversions with respect to the different slopes.

Figure 7A:
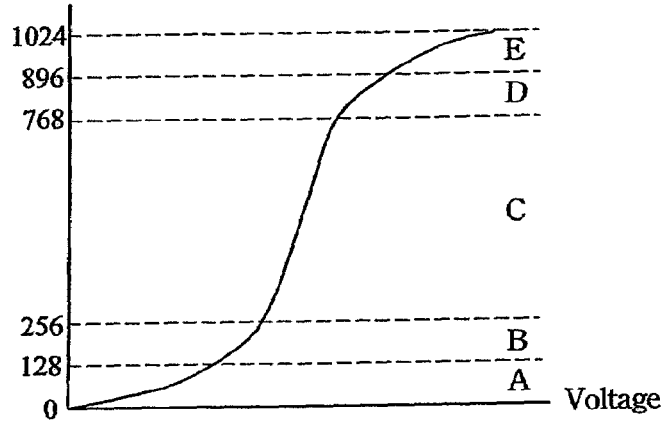
FIG. 7A is a schematic view of a gamma curve of one preferred embodiment.

FIG. 7A is a schematic view of a gamma curve of one preferred embodiment, which includes 10-bit (e.g. $2^{10} = 1024$) grayscales and their corresponding voltages. A gamma curve 700 is divided into five segments, A, B, C, D, and E, based on their different slopes. When a segment has a greater slope, such as the segment C, the grayscales within the segment correspond to a relatively smaller range of voltages. On the other hand, the grayscales within the segments A and E correspond to a relatively larger range of voltages, because the two segments A and E have smaller slopes.

Figure 7B:
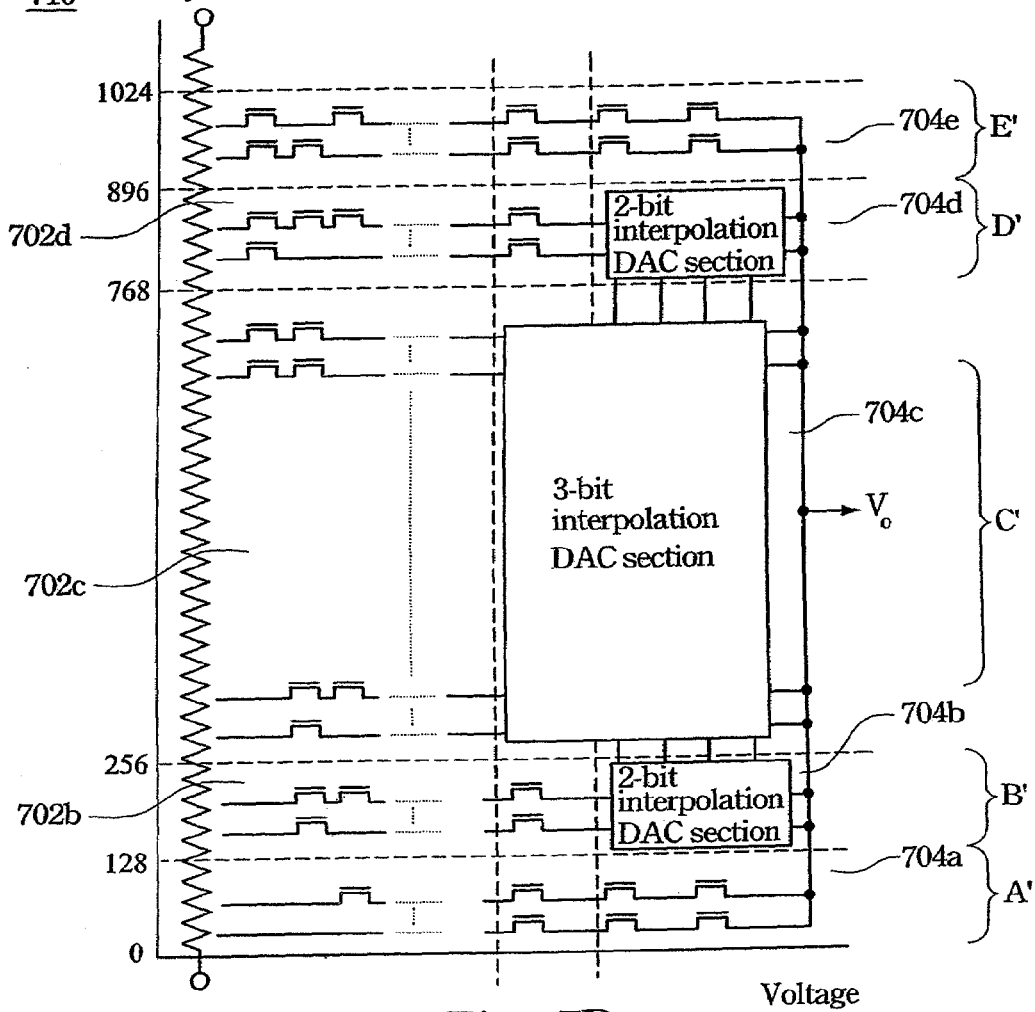
FIG. 7B is a schematic view of a 10-bit DAC of one preferred embodiment.

FIG. 7B is a schematic view of a 10-bit DAC of one preferred embodiment, which provides the gamma curve 700 illustrated in FIG. 7A. A 10-bit DAC 710 comprises five DAC portions A', B', C', D' and E' corresponding to the five segments A, B, C, D and E of the gamma curve 700. The 10-bit DAC 710 optimizes digital-to-analog conversions of the five segments A, B, C, D and E by correspondingly adjusting the numbers of bits processed by different DAC portions A', B', C', D' and E'.

More precisely, for the segment C having a greater slope, the DAC portions C' has a 7-bit R-string DAC section 702c and a 3-bit interpolation DAC section 704c. For the segments B and D having middle slopes, the DAC portions B' and D' respectively have 8-bit R-string DAC sections 702b and 702d, and 2-bit interpolation DAC sections 704b and 704d. For the segments A and E having smaller slopes, the DAC portions A' and E' respectively only have 10-bit R-string DAC section 702a and 702e.

In addition, the (M-N)bit interpolation DAC sections, such as 3-bit interpolation DAC section 704c or 2-bit interpolation DAC sections 704b and 704d can be a resistance interpolation circuit, or a capacitance interpolation circuit as well as the OTA interpolation circuit. With considering the balance between circuit performance and layout area, persons skilled in the art can choice a suitable type of the interpolation circuit for a segment having a certain slope.

Furthermore, this preferred embodiment can be described in another aspect. The DAC is arranged to convert an M-bit input word into an analog output signal. The DAC comprises a first DAC portion including an X-bit R-string DAC section and an (M-X)-bit interpolation DAC section coupled to the X-bit R-string DAC section; a second DAC portion including a Y-bit R-string DAC section coupled to the X-bit R-string DAC section and an (M-Y)-bit interpolation DAC section coupled to the Y-bit R-string DAC section; and a third DAC portion including a Z-bit R-string DAC section coupled to the Y-bit R-string DAC section. Wherein Z is greater than X and Y, and Y is greater than X.

The number of the bits processed by the (M-N)-bit interpolation DAC section is increased when the slope of the segment of the gamma curve is large; the number of the bits processed by the (M-N)-bit interpolation DAC section is decreased when the slope of the segment of the gamma curve is small. By correspondingly adjusting the numbers of bits processed by different DAC portions, such as increasing or decreasing the numbers of the (M-N)-bit interpolation DAC sections, the M-bit DAC can optimize the digital-to-analog conversions with respect to the segments of the gamma curve having different slopes. Consequently, the number of switching elements can be reduced and the chip size of the source driver is thus decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An M-bit digital-to-analog converter (DAC) for a source driver of a flat display, arranged to convert an M-bit input word into an analog output signal, the M-bit DAC comprising:
   a first DAC portion including:
      an X-bit R-string DAC section; and
      an (M-X)-bit interpolation DAC section, coupled to the X-bit R-string DAC section; and
   a second DAC portion including:
      a M-bit R-string DAC section coupled to the X-bit R-string DAC section;
   wherein M is greater than X, and M, X are numbers of bits.

2. The M-bit DAC of claim 1, wherein the (M-X)-bit interpolation DAC section is arranged to interpolate the analog output signal from the two neighboring grayscale voltages according to the (M-X)-bit least significant bit (LSB) subword of the M-bit input word, and the X-bit R-string DAC section comprises:
   a plurality of resistors electrically connected in series to provide a plurality of grayscale voltages; and
   a 2-of-X selector, coupled to the series-connected resistors, and arranged to select two neighboring grayscale voltages according to an X-bit most significant bit (MSB) subword of the M-bit input word.

3. The M-bit DAC of claim 2, wherein the 2-of-X selector comprises at least $2^X+1$ selecting lines correspondingly coupled to the resistors for providing the two grayscale voltages, and one of the selecting lines comprises X switching elements switched by the bits of the X-bit MSB subword.

4. The M-bit DAC of claim 2, wherein the two neighboring grayscale voltages are an xth voltage level and an (x+1)th voltage level, and x is positive integer.

5. The M-bit DAC of claim 2, wherein the (M-X)-bit interpolation DAC section comprises a select circuit and a plurality of operational transconductance amplifiers, and the select circuit is arranged to input corresponding grayscale voltages to the operational transconductance amplifiers according to the (M-X)-bit LSB subword.

6. The M-bit DAC of claim 5, wherein positive input terminals of the operational transconductance amplifiers are respectively coupled to corresponding grayscale voltages, and output terminals and negative input terminals of the operational transconductance amplifiers are coupled together.

7. The M-bit DAC of claim 2, wherein the (M-X)-bit interpolation DAC section comprises an operational transconductance amplifier (OTA) interpolation circuit.

8. The M-bit DAC of claim 7, wherein the OTA interpolation circuit comprises a select circuit and a plurality of operational transconductance amplifiers, and the select circuit is arranged to input corresponding grayscale voltages to the operational transconductance amplifiers according to the (M-X)-bit LSB subword.

* * * * *